United States Patent
Imabayashi et al.

(10) Patent No.: US 12,317,734 B2
(45) Date of Patent: May 27, 2025

(54) DISPLAY DEVICE AND DISPLAY DEVICE PRODUCTION METHOD

(71) Applicant: SHARP KABUSHIKI KAISHA, Osaka (JP)

(72) Inventors: Hiroki Imabayashi, Osaka (JP); Masayuki Kanehiro, Osaka (JP); Hisayuki Utsumi, Osaka (JP); Shota Okamoto, Osaka (JP); Yohei Nakanishi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 483 days.

(21) Appl. No.: 17/914,333

(22) PCT Filed: Apr. 7, 2020

(86) PCT No.: PCT/JP2020/015618
§ 371 (c)(1),
(2) Date: Sep. 24, 2022

(87) PCT Pub. No.: WO2021/205525
PCT Pub. Date: Oct. 14, 2021

(65) Prior Publication Data
US 2023/0120913 A1    Apr. 20, 2023

(51) Int. Cl.
| | |
|---|---|
| H10K 71/12 | (2023.01) |
| G03F 7/029 | (2006.01) |
| H10K 50/115 | (2023.01) |
| H10K 50/14 | (2023.01) |
| H10K 59/35 | (2023.01) |
| H10K 71/20 | (2023.01) |
| H10K 85/10 | (2023.01) |
| H10K 85/60 | (2023.01) |
| H10K 59/12 | (2023.01) |
| H10K 59/80 | (2023.01) |
| H10K 102/00 | (2023.01) |

(52) U.S. Cl.
CPC ............. *H10K 71/12* (2023.02); *G03F 7/029* (2013.01); *H10K 50/115* (2023.02); *H10K 50/14* (2023.02); *H10K 59/35* (2023.02); *H10K 71/20* (2023.02); *H10K 85/10* (2023.02); *H10K 85/631* (2023.02); *H10K 85/6572* (2023.02); *H10K 59/12* (2023.02); *H10K 59/8731* (2023.02); *H10K 2102/3026* (2023.02)

(58) Field of Classification Search
None
See application file for complete search history.

(56) References Cited

U.S. PATENT DOCUMENTS

2023/0209924 A1* 6/2023 Okamoto ............. H10K 50/115
257/40

FOREIGN PATENT DOCUMENTS

JP         2012-234748 A    11/2012

\* cited by examiner

*Primary Examiner* — Anthony Ho
(74) *Attorney, Agent, or Firm* — ScienBiziP, P.C.

(57) ABSTRACT

A display device provided with a display region including a plurality of pixels and a frame region surrounding the display region includes a thin film transistor layer, a light-emitting element layer including a plurality of light-emitting elements, each including a first electrode, a light emitting layer, and a second electrode, and each having a different luminescent color. In the light-emitting layer, an oxetane monomer, an epoxy monomer, and a radical polymerization initiator are used.

13 Claims, 13 Drawing Sheets

(a)

(b)

(c)

ively manufacture a high-definition display device, for example, formation of at least one layer included in the function layer, such as the light-emitting layer, for example, using a technique of dripping droplets such as a spin-coating method or an ink-jet application method instead of formation using the existing vapor deposition technique has been proposed (refer to, for example, PTL 1 below), for example.

DISPLAY DEVICE AND DISPLAY DEVICE PRODUCTION METHOD

TECHNICAL FIELD

The disclosure relates to a display device and a method of manufacturing a display device.

BACKGROUND ART

In recent years, self-luminous display devices have been developed and put into practical use in place of non-self-luminous liquid crystal display devices. In such a display device that does not require a backlight device, a light-emitting element, such as an organic light-emitting diode (OLED) or a quantum dot light emitting diode (QLED), for example, is provided for each pixel.

Further, a self-luminous display device such as described above is provided with a function layer including a first electrode, a second electrode, and at least a light-emitting layer disposed between the first electrode and the second electrode. Furthermore, with such a display device, in order to cost-effectively and easily manufacture a high-definition display device, for example, formation of at least one layer included in the function layer, such as the light-emitting layer, for example, using a technique of dripping droplets such as a spin-coating method or an ink-jet application method instead of formation using the existing vapor deposition technique has been proposed (refer to, for example, PTL 1 below), for example.

CITATION LIST

Patent Literature

PTL 1: JP 2012-234748 A

SUMMARY

Technical Problem

However, in a known display device and method of manufacturing a display device such as described above, a solution (droplets) containing a functional material (that is, luminescent material) of the light-emitting layer and a predetermined solvent is dripped or applied, and then the solution is dried (the solvent is evaporated) to form the light-emitting layer, for example. Further, in the known display device and method of manufacturing a display device, usually a polymer resin material obtained by combining, for example, a polymer or a monomer and a radical polymerization initiator is added to the solution described above in order to pattern the light-emitting layer in a desired shape.

However, in a known display device and method of manufacturing a display device such as described above, there is a problem in that it may not be possible to precisely form a light-emitting layer having an appropriate film thickness due to a coffee ring phenomenon that occurs when the solution of the light-emitting layer dries or a type or an added amount of the polymer resin material or the like not being suitable, resulting in deterioration in display performance.

In light of the problems described above, an object of the disclosure is to provide a display device and a method of manufacturing a display device that can prevent display performance deterioration even when a light-emitting layer is formed by using a dripping technique.

Solution to Problem

In order to achieve the object described above, a display device according to the disclosure is provided with a display region including a plurality of pixels and a frame region surrounding the display region. The display device includes a thin film transistor layer, and a light-emitting element layer including a plurality of light-emitting elements, each including a first electrode, a light-emitting layer, and a second electrode, and each having a different luminescent color. In the light-emitting layer, an oxetane monomer, an epoxy monomer, and a radical polymerization initiator are used.

In the display device configured as described above, by using an oxetane monomer, an epoxy monomer, and a radical polymerization initiator in the light-emitting layer, the inventors of the disclosure found that a light-emitting layer having an appropriate film thickness can be precisely formed, even when the light-emitting layer is formed by using a dripping technique. The disclosure was completed on the basis of findings such as described above, and can constitute a display device that can prevent deterioration in display performance, even when the light-emitting layer is formed by using a dripping technique.

Further, a method of manufacturing a display device according to the disclosure is a method of manufacturing a display device provided with a display region including a plurality of pixels and a frame region surrounding the display region, the display device including a thin film transistor layer, and a light-emitting element layer including a plurality of light-emitting elements, each including a first electrode, a light-emitting layer, and a second electrode, and each having a different luminescent color. The method includes dripping a solution configured to form the light-emitting layer, the solution including a predetermined solvent, an oxetane monomer, an epoxy monomer, and a radical polymerization initiator, above the first electrode, exposing the solution by, with an exposure mask placed above the solution, irradiating the solution with a predetermined irradiation light from above the exposure mask, forming an intermediate layer of the light-emitting layer by drying the solvent in the solution, patterning the intermediate layer in a predetermined shape by performing a development process on the intermediate layer using a predetermined developing solution, and forming the light-emitting layer above the first electrode by curing the intermediate layer patterned.

In the method of manufacturing a display device configured as described above, in the dripping of the solution, a solution configured to form the light-emitting layer and including a predetermined solvent, an oxetane monomer, an epoxy monomer, and a radical polymerization initiator is dripped above the first electrode. Further, the exposure, the formation of the intermediate layer, the patterning, and the formation described above are sequentially performed on the solution dripped. Accordingly, a light-emitting layer having an appropriate film thickness can be precisely formed. As a result, deterioration in the display performance of the display device can be prevented.

Advantageous Effects of Disclosure

According to the present method, display performance deterioration can be prevented even when a light-emitting layer is formed by using a dripping technique.

DESCRIPTION OF EMBODIMENTS

Embodiments of the disclosure will be described below in detail with reference to the drawings. Note that the disclosure is not limited to each embodiment to be described below. Further, in the following description, a "same layer" means that the layer is formed through the same process (film formation process), a "lower layer" means that the layer is formed in a process before the layer being compared, and an "upper layer" means that the layer is formed in a process after the layer being compared. In addition, in each of the drawings, the dimensions of constituent elements are not precisely illustrated as the actual dimensions of the constituent elements and the dimensional proportions of each of the constituent elements.

First Embodiment

Figure 1:
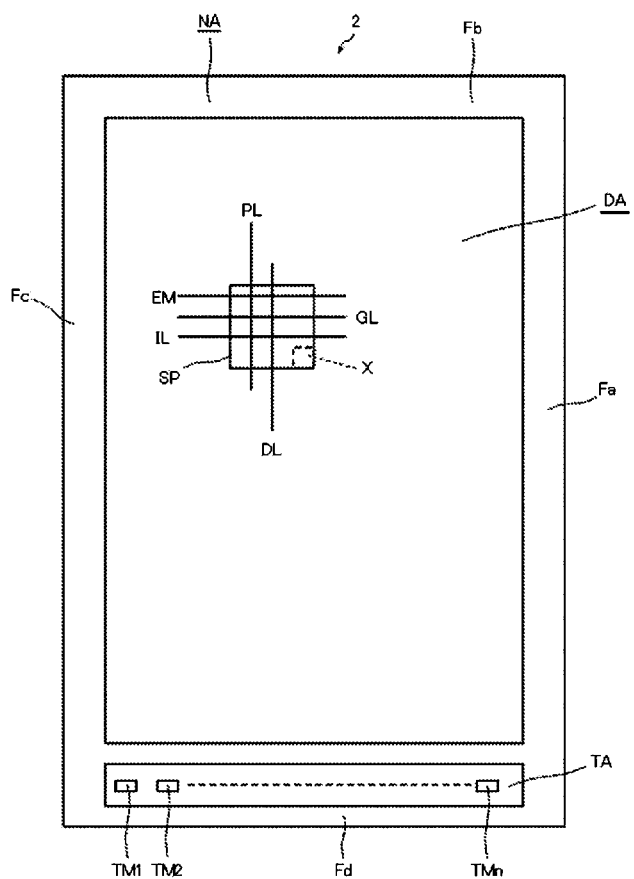
FIG. 1 is a schematic view illustrating a configuration of a display device according to a first embodiment of the disclosure.
Figure 2:
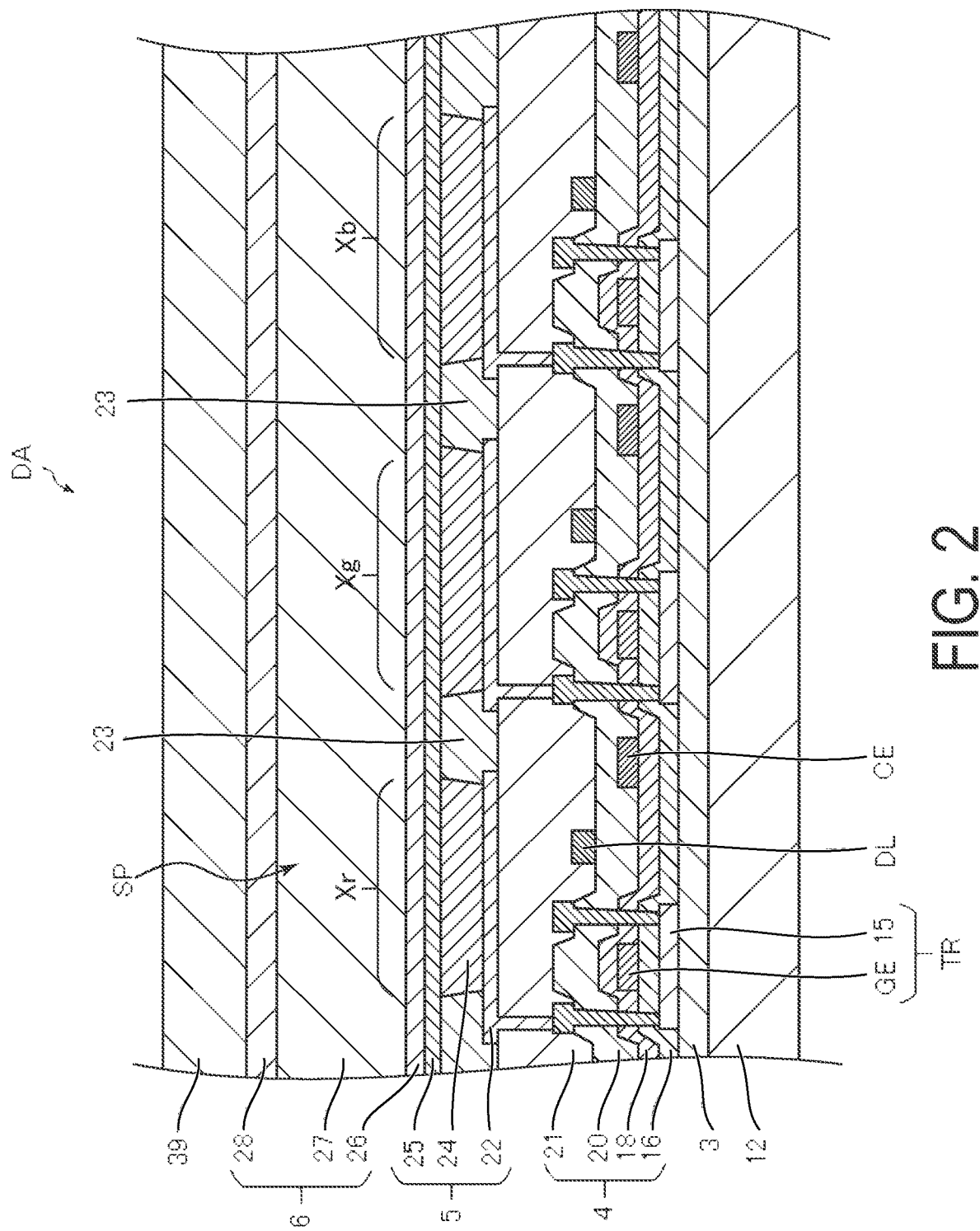
FIG. 2 is a cross-sectional view illustrating a configuration of main portions of the display device illustrated in FIG. 1.
Figure 3:
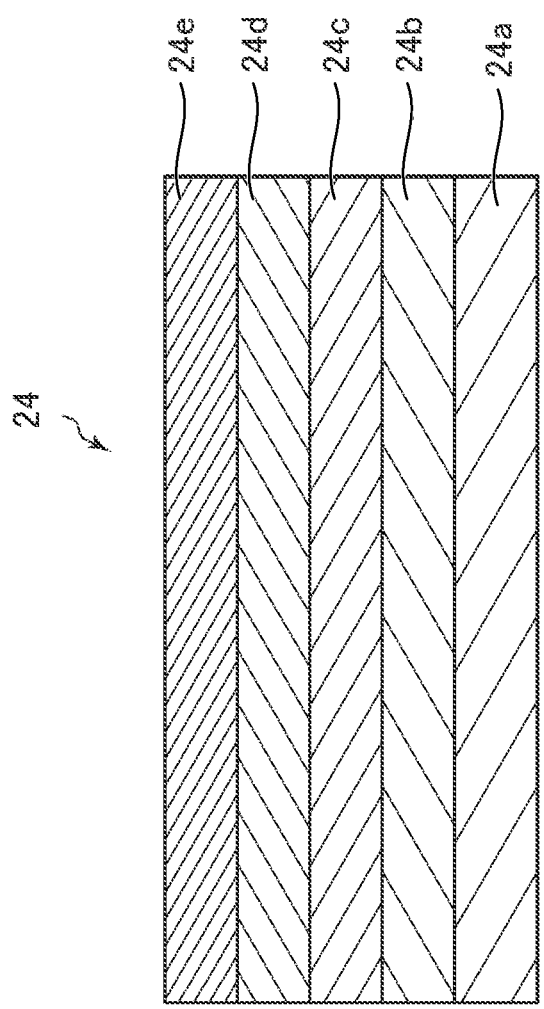
FIG. 3 is a cross-sectional view illustrating a specific configuration of a function layer illustrated in FIG. 2.
Figure 4:
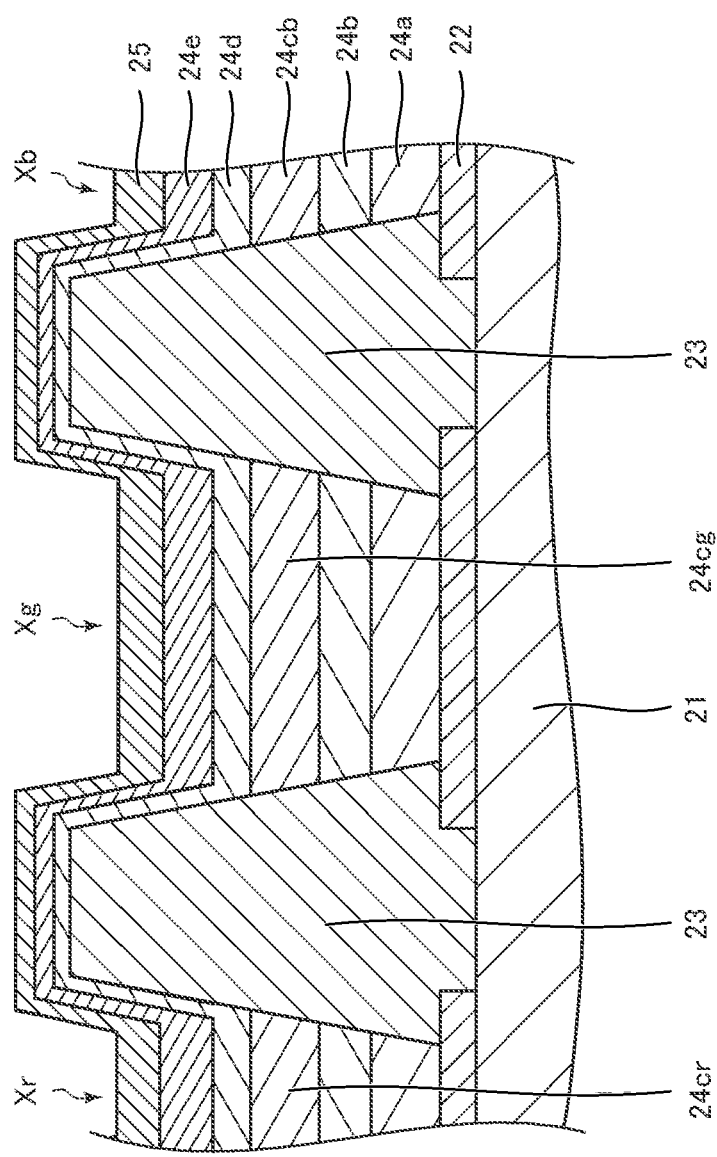
FIG. 4 is a cross-sectional view illustrating a specific configuration example of a light-emitting element illustrated in FIG. 2.

FIG. 1 is a schematic view illustrating a configuration of a display device according to a first embodiment of the disclosure. FIG. 2 is a cross-sectional view illustrating a configuration of main portions of the display device illustrated in FIG. 1. FIG. 3 is a cross-sectional view illustrating a specific configuration of a function layer illustrated in FIG. 2. FIG. 4 is a cross-sectional view illustrating a specific configuration example of a light-emitting element illustrated in FIG. 2.

As illustrated in FIG. 1 and FIG. 2, in a display device 2 of the present embodiment, a barrier layer 3, a thin film transistor (TFT) layer 4, a top emission light-emitting element layer 5, and a sealing layer 6 are provided in this order on a base material 12, and a plurality of subpixels SP are formed in a display region DA. A frame region NA surrounding the display region DA includes four side edges Fa to Fd, and a terminal portion TA for mounting an electronic circuit board (an IC chip, a FPC, or the like) is formed at the side edge Fd. The terminal portion TA includes a plurality of terminals TM1, TM2 and TMn (where n is an integer of 2 or greater). As illustrated in FIG. 1, the plurality of terminals TM1, TM2, and TMn are provided along one side of the four sides of the display region DA. Note that driver circuits (not illustrated) may be formed on each of the side edges Fa to Fd.

The base material 12 may be a glass substrate or a flexible substrate including a resin film such as polyimide. Further, the base material 12 may also constitute a flexible substrate formed of two layers of resin films and an inorganic insulating film interposed between these resin films. Furthermore, a film such as a polyethylene terephthalate (PET) film may be applied to a lower face of the base material 12. Further, when a flexible substrate is used as the base material 12, the display device 2 having flexibility, that is, a flexible display device, may also be formed.

The barrier layer 3 is a layer that inhibits foreign matters such as water and oxygen from penetrating the thin film transistor layer 4 and the light-emitting element layer 5. For example, the barrier layer 3 can be constituted by a silicon oxide film, a silicon nitride film, or a silicon oxynitride film, or a layered film thereof formed by chemical vapor deposition (CVD).

As illustrated in FIG. 2, the thin film transistor layer 4 includes a semiconductor layer (including a semiconductor film 15) as an upper layer overlying the barrier layer 3, an inorganic insulating film 16 (a gate insulating film) as an upper layer overlying the semiconductor layer, a first metal layer (including a gate electrode GE) as an upper layer overlying the inorganic insulating film 16, an inorganic insulating film 18 as an upper layer overlying the first metal layer, a second metal layer (including a capacitance electrode CE) as an upper layer overlying the inorganic insulating film 18, an inorganic insulating film 20 as an upper layer overlying the second metal layer, a third metal layer (including a data signal line DL) as an upper layer overlying the inorganic insulating film 20, and a flattening film 21 as an upper layer overlying the third metal layer.

The semiconductor layer described above is constituted by, for example, amorphous silicon, low-temperature polycrystalline silicon (LTPS), or an oxide semiconductor, and a thin film transistor TR is configured to include the gate electrode GE and the semiconductor film 15.

Note that, although the thin film transistor TR of a top gate type is exemplified in the present embodiment, the thin film transistor TR may be a thin film transistor of a bottom gate type.

A light-emitting element X and a control circuit thereof are provided for each of the subpixels SP in the display region DA, and the control circuit and wiring lines connected to the control circuit are formed in the thin film transistor layer 4. Examples of the wiring lines connected to the control circuit include a scanning signal line GL and a light emission control line EM both formed in the first metal layer, an initialization power source line IL formed in the second metal layer, and the data signal line DL and a high voltage power source line PL both formed in the third metal layer. The control circuit includes a drive transistor that controls the current of the light-emitting element X, a writing transistor that electrically connects to a scanning signal line, a light emission control transistor that electrically connects to a light emission control line, and the like (not illustrated).

The first metal layer, the second metal layer, and the third metal layer described above are each formed of a single layer film or a multi-layer film of metal, the metal including at least one of aluminum, tungsten, molybdenum, tantalum, chromium, titanium, and copper, for example.

The inorganic insulating films 16, 18, and 20 can be formed of, for example, a silicon oxide (SiOx) film or a silicon nitride (SiNx) film, or a layered film of these, formed using CVD. The flattening film 21 can be formed of, for example, a coatable organic material such as polyimide or acrylic resin.

The light-emitting element layer 5 includes a first electrode (anode electrode) 22 as an upper layer overlying the flattening film 21, an edge cover film 23 having insulating properties and covering an edge of the first electrode 22, a function layer 24 as an upper layer overlying the edge cover film 23, and a second electrode (cathode electrode) 25 as an upper layer overlying the function layer 24. That is, the light-emitting element layer 5 is formed with a plurality of the light-emitting elements X, each including the first electrode 22, a light-emitting layer described below included in the function layer 24, and the second electrode 25, and each having a different luminescent color. The edge cover film 23 is formed by applying an organic material such as polyimide or an acrylic resin and then patterning the organic material by a photolithography method, for example. Further, this edge cover film 23 partitions a pixel (subpixel SP) overlapping an end portion of a surface of the first electrode 22 having an island shape, and is a bank that defines the plurality of pixels (subpixels SP) corresponding to each of the plurality of light-emitting elements X. Further, the function layer 24 is an electroluminescence (EL) layer including an electroluminescence element.

The light-emitting element layer 5 is formed with a light-emitting element Xr (red), a light-emitting element Xg (green), and a light-emitting element Xb (blue) having different luminescent colors and included in the light-emitting element X described above. Each light-emitting element X includes the first electrode 22, the function layer 24 (including the light-emitting layer), and the second electrode 25. The first electrode 22 is an island-shaped electrode provided for each light-emitting element X (that is, subpixel SP). The second electrode 25 is a solid-like common electrode common to all light-emitting elements X.

The light-emitting elements Xr, Xg, and Xb each may be, for example, an organic light-emitting diode (OLED) in which a light-emitting layer described below is an organic light-emitting layer, or may be a quantum dot light emitting diode (QLED) in which the light-emitting layer is a quantum dot light-emitting layer.

For example, the function layer 24 is constituted by layering a hole injection layer 24a, a hole transport layer 24b, a light-emitting layer 24c, an electron transport layer 24d, and an electron injection layer 24e in this order, from the lower layer side. Further, an electron blocking layer and a hole blocking layer may also be provided in the function layer 24. The light-emitting layer 24c is applied by a dripping technique such as a spin-coating method or ink-jet method, and subsequently formed in an island shape by patterning by a photolithography method or the like. Other layers are formed in an island shape or a solid-like shape (common layer). Further, in the function layer 24, a configuration may be adopted in which one or more layers of the hole injection layer 24a, the hole transport layer 24b, the electron transport layer 24d, and the electron injection layer 24e are not formed.

The display device 2 according to the present embodiment has a so-called known structure in which the anode electrode (first electrode 22), the function layer 24, and the cathode electrode (second electrode 25) are provided in this order from the thin film transistor layer 4 side, as exemplified in FIG. 2.

Further, as illustrated in FIG. 4, in the display device 2 of the present embodiment, the light-emitting elements Xr, Xg, Xb are partitioned by the edge cover film 23 serving as a bank, and the first electrode 22 having an island shape, the hole injection layer 24a having an island shape, the hole transport layer 24b having an island shape, and light-emitting layers 24cr, 24cg, 24cb having island shapes (collectively referred to as light-emitting layer 24c) are provided for each light-emitting element X. Further, in the light-emitting element X, the electron transport layer 24d that is solid-like, the electron injection layer 24e that is solid-like, and the second electrode 25 that is solid-like, all common to all subpixels SP, are provided. Note that, in addition to the above description, the configuration may be one in which the hole injection layer 24a that is solid-like and/or the hole transport layer 24b that is solid-like are provided.

When the organic light-emitting layer (light-emitting layer 24c) of the OLED is formed by vapor deposition, a fine metal mask (FMM) is used. The FMM is a sheet (made of Invar material, for example) including a large number of openings, and an island-shaped organic layer (corresponding to one subpixel SP) is formed of an organic material passing through one of the openings. Further, other than as described here, the organic light-emitting layer (light-emitting layer 24c) of the OLED can be formed by a dripping technique using a predetermined solution.

Further, when the light-emitting elements Xr, Xg, and Xb are OLEDs, positive holes and electrons recombine inside the light-emitting layer 24c in response to a drive current between the first electrode 22 and the second electrode 25, and light is emitted when the excitons generated in this manner transition to a ground state. Since the second electrode 25 has a high light-transmitting property and the first electrode 22 has light reflectivity, the light emitted from the function layer 24 is directed upward to configure a top-emitting structure.

For the quantum dot light-emitting layer (light-emitting layer 24c) of the QLED, an island-shaped quantum dot light-emitting layer (corresponding to one subpixel SP) can be formed by applying a solution in which quantum dots are diffused in a solvent by using a dripping technique such as an inkjet method, and patterning the applied solution using a photolithography method, for example.

Further, when the light-emitting elements Xr, Xg, and Xb are QLEDs, positive holes and electrons recombine inside the light-emitting layer 24c in response to a drive current between the first electrode 22 and the second electrode 25, and light (fluorescence) is emitted when the excitors generated in this manner transition from the conduction band level of the quantum dots to the valence band level.

A light-emitting element including a light-emitting element other than the OLED and QLED described above, such as an inorganic light-emitting diode, for example, may be used in the light-emitting element layer 5.

Further, in the following description, a case in which the light-emitting layer 24c is formed by a quantum dot light-emitting layer including quantum dots will be described as an example. That is, in the display device 2 according to the present embodiment, the red light-emitting element Xr includes a red quantum dot light-emitting layer that emits red light, the green light-emitting element Xg includes a green quantum dot light-emitting layer that emit green light, and the blue light-emitting element Xb includes a blue quantum dot light-emitting layer that emit blue light.

The quantum dot light-emitting layer (light-emitting layer 24c) includes quantum dots as a functional material contributing to the function of the light-emitting layer 24c and, in each of the light-emitting layers 24cr, 24cg, 24cb of each color, at least the particle sizes of the quantum dots are configured to be different from each other in accordance with the light emission spectrum. Furthermore, as described in detail below, in this light-emitting layer 24c, an oxetane monomer, an epoxy monomer, and a radical polymerization initiator are used.

The first electrode (anode electrode) 22 is composed of layering of an indium tin oxide (ITO) and silver (Ag) or Al or an alloy including Ag or Al, for example, and has light reflectivity. The second electrode (cathode electrode) 25 is a transparent electrode which is constituted of, for example, a thin film of Ag, Au, Pt, Ni, Ir, or Al, a thin film of a MgAg alloy, or a light-transmissive conductive material such as ITO, or indium zinc oxide (IZO). Note that, other than those described, the configuration may be one in which a metal nanowire such as silver is used to form the second electrode 25, for example. When the second electrode 25, which is a solid-like common electrode on the upper layer side, is formed using such a metal nanowire, the second electrode 25 can be provided by applying a solution including the metal nanowire. As a result, in the light-emitting element layer 5 of the display device 2, each layer of the function layer 24 and the second electrode 25, other than the first electrode 22, can be formed by a dripping technique using a predetermined solution, making it possible to easily configure the display device 2 of simple manufacture.

The sealing layer 6 has a light-transmitting property, and includes an inorganic sealing film 26 directly formed on the second electrode 25 (in contact with the second electrode 25), an organic film 27 as an upper layer overlying the inorganic sealing film 26, and an inorganic sealing film 28 as an upper layer overlying the organic film 27. The sealing layer 6 covering the light-emitting element layer 5 inhibits foreign matters such as water and oxygen from penetrating the light-emitting element layer 5. Note that, when the light-emitting layer 24c is constituted by a quantum dot light-emitting layer, installation of the sealing layer 6 can be omitted.

The organic film 27 has a flattening effect and is transparent, and can be formed by, for example, ink-jet application using a coatable organic material. The inorganic sealing films 26 and 28 are inorganic insulating films and can be formed of a silicon oxide film, a silicon nitride film, a silicon oxynitride film, or a layered film of these, formed by CVD, for example.

A function film 39 has at least one of an optical compensation function, a touch sensor function, a protection function, and the like.

Figure 5:
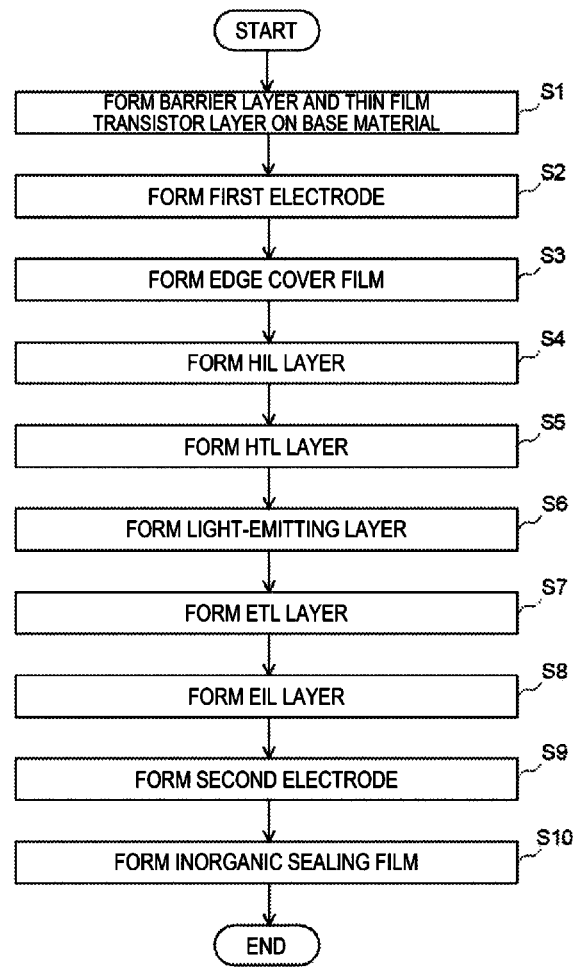
FIG. 5 is a flowchart illustrating a method of manufacturing the display device described above.

Next, a method of manufacturing the display device 2 of the present embodiment will be specifically described with reference to FIG. 5 as well. FIG. 5 is a flowchart illustrating a method of manufacturing the display device described above.

As illustrated in FIG. 5, in the method of manufacturing the display device 2 of the present embodiment, first, the barrier layer 3 and the thin film transistor layer 4 are formed on the base material 12 (step S1). Next, the first electrode (anode electrode) 22 is formed on the flattening film 21 using, for example, a sputtering method and a photolithography method (step S2). Then, the edge cover film 23 is formed (step S3).

Next, the hole injection layer (HIL) 24a is formed by a dripping technique such as an ink-jet method (step S4). Specifically, in this hole injection layer formation process, 2-propanol, butyl benzoate, toluene, chlorobenzene, tetrahydrofuran, or 1,4 dioxane, for example, is used as a solvent included in a solution for hole injection layer formation. Further, for example, a polythiophene-based conductive material such as PEDOT:PSS, or an inorganic compound such as nickel oxide or tungsten oxide, is used as a solute, that is, hole injection material (functional material), included in the solution for hole injection layer formation. Then, in this HIL layer formation process, the hole injection layer 24a having a film thickness of, for example, from 20 nm to 50 nm is formed by baking, at a predetermined temperature, the solution for hole injection layer formation, that has been dripped onto the first electrode 22.

Note that, when the light-emitting elements Xr, Xg, and Xb are OLEDs, the hole injection material (functional material) of the solution for hole injection layer formation may be, in addition to the materials described above, benzene, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives thereof, and chain-type conjugated organic polymers such as polysilane compounds, vinylcarbazole compounds, thiophene compounds, and aniline compounds, for example. Further, as the solvent of the solution for hole injection layer formation in the case of OLEDs, the same solvents as those in the case of QLEDs described above can be used.

Then, the hole transport layer (HTL) 24b is formed by a dripping technique such as an inkjet method (step S5). Specifically, in this hole transport layer formation process, chlorobenzene, toluene, tetrahydrofuran, or 1,4 dioxane, for example, is used as a solvent included in a solution for hole transport layer formation. Further, as a solute, that is, hole transport material (functional material), included in the solution for hole transport layer formation, for example, an organic polymer compound such as tetrafluorobenzobarrelene (TFB), polyvinylcarbazole (PVK), or poly-TPD, or an inorganic compound such as nickel oxide is used. Then, in this HTL layer formation process, the hole transport layer 24b having a film thickness of, for example, from 20 nm to 50 nm is formed by baking, at a predetermined temperature, the solution for hole transport layer formation that has been dripped onto the hole injection layer 24a.

Note that, when the light-emitting elements Xr, Xg, and Xb are OLEDs, the hole transport material (functional material) of the solution for hole transport layer formation may be, in addition to the materials described above, benzene, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives thereof, and chain-type conjugated organic polymers such as polysilane compounds, vinylcarbazole compounds, thiophene compounds, and aniline compounds, for example. Further, as the solvent of the solution for hole transport layer formation in the case of OLEDs, the same solvents as those in the case of QLEDs described above can be used.

Next, the light-emitting layer (ELM) 24c is formed by a dripping technique such as an ink-jet method (step S6). Specifically, in this fight-emitting layer formation process, for example, toluene or propylene glycol monomethyl ether acetate (PGMEA) is used as the solvent included in a solution for light-emitting layer formation. Further, as the solvent, that is, the luminescent material (functional material), quantum dots including C, Si, Ge, Sn, P, Se, Te, Cd, Zn, Mg, S, In, or O, are used, for example. Further, as described above, this solution for light-emitting layer formation includes a polymer resin material including an oxetane monomer and an epoxy monomer, and a radical polymerization initiator.

Note that, when the light-emitting elements Xr, Xg, and Xb are OLEDs, the luminescent material (functional material) used in the solution for light-emitting layer formation may be, in addition to an organic compound or the quantum dots including C, Si, Ge, Sn, P, Se, Te, Cd, Zn, Mg, S, In, or O mentioned above, for example, an organic luminescent material such as anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, derivatives thereof, tri(dibenzoylmethyl) phenanthroline europium complex, and ditoluylvinylbiphenyl. Further, as the solvent, the polymer resin material, and the radical polymerization initiator of the solution for light-emitting layer formation in the case of OLEDs, the same as those in the case of QLEDs described above can be used.

Figure 6:
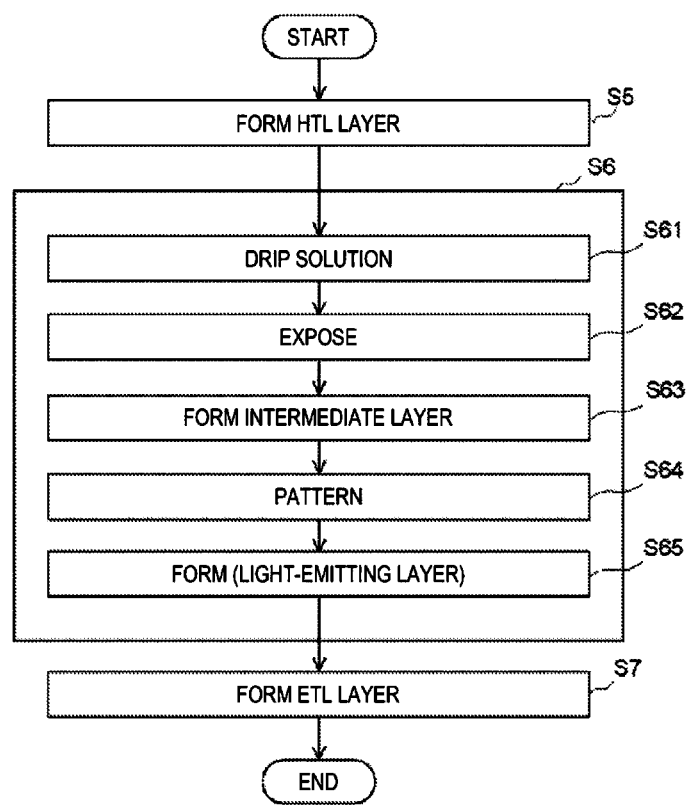
FIG. 6 is a flowchart illustrating a specific manufacturing method of a configuration of the main portions of the display device described above.

The light-emitting layer formation process will now be described in detail with reference to FIG. 6 as well. FIG. 6 is a flowchart illustrating a specific manufacturing method of a configuration of the main portions of the display device described above.

In the light-emitting layer formation process illustrated in step S6, as a preliminary step, at least one of a quantum dot, an oxetane monomer, an epoxy monomer, and a radical polymerization initiator described above is added to toluene as a solvent, for example, to create the solution for light-emitting layer formation. Then, as illustrated in step S61 in FIG. 6, a solution dripping process in which the solution for light-emitting layer formation described above is dripped above the first electrode 22, specifically, onto the hole transport layer 24b, is performed.

An oxetane monomer is a monomer material including an oxetane group. Further, this oxetane monomer includes a charge transport material to improve the transport properties of positive holes and electrons in the light-emitting layer 24c. This charge transport material includes, for example, TPD (N,N'-bis(4-butylphenyl)-N,N'-bis(phenyl)-benzidine) and derivatives thereof.

The epoxy monomer includes, for example, an epoxy group such as an alicyclic epoxy or glycidyl epoxy. Further, this epoxy monomer includes a charge transport material to improve the transport properties of positive holes and electrons in the light-emitting layer 24c. This charge transport material includes, for example, carbazole, TPD, and derivatives thereof.

Furthermore, in the solution for light-emitting layer formation, the combination ratio of the oxetane monomer to the epoxy monomer is selected as a value within a range from 95:5 to 50:50. By setting the combination ratio to a value within this range, in the present embodiment, the light-emitting layer 24c having an appropriate film thickness with precision can be more reliably formed.

Note that when the combination ratio of the epoxy monomer is less than 5, the amount of film reduction in the intermediate layer of the light-emitting layer 24c increases in the development process described below, deteriorating the patterning performance in the subsequent patterning process. On the other hand, when the combination ratio of the epoxy monomer is greater than 50, the amount of film remaining in the intermediate layer of the light-emitting layer 24c increases in the development process. That is, in each of these cases, the light-emitting layer 24c having an appropriate film thickness cannot be precisely formed.

The radical polymerization initiator is, for example, a photoacid generator. Further, the photoacid generator includes, for example, a salt obtained by combining an iodonium salt-based or sulfonium salt-based cation and an anion of $(Rf)_n PF_{6-n}$ (where Rf is a perfluoroalkyl group), $B(C_6F_5)_4$, $SbF_6$, $PF_4$, $BF_4$, $CF_3SO_3$, $HSO_4$, or $SO_4^{3-}$.

Next, as illustrated in step S62 in FIG. 6, an exposure process of exposing the solution for light-emitting layer formation by, with an exposure mask (not illustrated) placed above the solution for light-emitting layer formation, irradiating the solution with a predetermined irradiation light from above the exposure mask is performed. In this exposure process, ultraviolet light (UV light) such as, for example, i line, g line, or h line is used as the irradiation light and, by irradiating the solution with such irradiation light, an acid is generated from the photoacid generator described above to initiate a polymerization reaction in each of the oxetane monomer and the epoxy monomer. Note that, in the oxetane monomer and the epoxy monomer, all monomers are not necessarily polymerized by the polymerization reaction and, even after completion of the display device 2, the oxetane monomer and the epoxy monomer can be extracted and the use thereof can be demonstrated.

Then, as illustrated in step S63 in FIG. 6, an intermediate layer formation process of drying the solvent described above in the solution for light-emitting layer formation and thus forming the intermediate layer of the light-emitting layer 24c is performed. In this intermediate layer formation process, the solution for light-emitting layer formation is pre-baked at a predetermined temperature (from 60° C. to 90° C., for example) or dried in a vacuum environment, thereby evaporating (drying) the solvent.

Next, as illustrated in step S64 in FIG. 6, a patterning process of patterning the intermediate layer in a predetermined shape is performed by performing a development process on the intermediate layer described above using a predetermined developing solution. By this patterning process, in the red light-emitting element Xr, for example, an intermediate layer of the red light-emitting layer 24cr is formed on the hole transport layer 24b in a space surrounded by the edge cover film 23. Further, a toluene, PGMEA, or alkaline resist developing solution, for example, is used as the developing solution.

Lastly, as illustrated in step S65 in FIG. 6, a formation process of curing the intermediate layer thus patterned, thereby forming the light-emitting layer 24c above the first electrode 22 (on the hole transport layer 24b) is performed. In this formation process, the intermediate layer on the hole transport layer 24b is baked at a predetermined temperature (from 70° C. to 100° C., for example), curing and drying the intermediate layer as the light-emitting layer 24c.

Subsequently, the solution dripping process, the exposure process, the intermediate layer formation process, the patterning process, and the light-emitting layer formation process illustrated in step S61 to step S65 are sequentially repeatedly performed for each luminescent color. As a result, as illustrated in FIG. 4, the light-emitting layer 24cr of the red light-emitting element Xr is formed, the light-emitting layer 24cg of the green light-emitting element Xg is formed, and further the light-emitting layer 24cb of the blue light-emitting element Xb is formed. As a result, in the present embodiment, the dripping technique and the photolithography method are combined to form a pixel pattern corresponding to the three colors RGB, and the separate-patterning of RGB is completed.

Next, returning to FIG. 5, the electron transport layer (ETL) 24d is formed by a dripping technique such as an ink-jet method or a spin-coating method (step S7). Specifically, in this electron transport layer formation process, 2-propanol, ethanol, toluene, chlorobenzene, tetrahydrofuran, or 1,4 dioxane, for example, is used as a solvent of a solution for electron transport layer formation. Further, as a solute, that is, electron transport material (functional material), nanoparticles of zinc oxide (ZnO) or magnesium-doped zinc oxide (MgZnO) are used, for example.

Note that, in a case in which the light-emitting elements Xr, Xg, and Xb are OLEDs, as the electron transport material (functional material) of the solution for electron transport layer formation described above, in addition to the nanoparticles of zinc oxide (ZnO) and magnesium-doped zinc oxide (MgZnO) described above, for example, quinoline, perylene, phenanthroline, bis-styryl, pyrazine, triazole, oxazole, oxadiazole, fluorenone, and derivatives and metal complexes thereof, more specifically, for example, 3,3'-bis(9H-carbazole-9-yl)biphenyl (mCBP), 1,3,5-tris(N-phenyl-benzimidazol-2-yl)benzene (TPBI), 3-phenyl-4(1'-naphthyl)-5-phenyl-1,2,4-triazole (TAZ), 1,10-phenanthroline, and Alq (tris(8-hydroxyquinoline)aluminum) can be used. Further, as the solvent of the solution for electron transport layer formation in the case of OLEDs, the same solvents as those in the case of QLEDs described above can be used.

Next, the electron injection layer (EIL) 24e is formed by a dripping technique such as an ink-jet method or a spin-coating method (step S8). Specifically, in this electron injection layer formation process, 2-propanol, ethanol, toluene, chlorobenzene, tetrahydrofuran, or 1,4 dioxane, for example, is used as a solvent of a solution for electron injection layer formation. Further, as a solute, that is, electron injection material (functional material), nanoparticles of zinc oxide (ZnO) or magnesium-doped zinc oxide (MgZnO) are used, for example. Further, as an additive material, an organic salt selected from the group consisting of quaternary ammonium salts, lithium tetrafluoroborate salts, and lithium hexafluorophosphate salts is used, for example, as in the solution for hole injection layer formation described above.

Note that, in a case in which the light-emitting elements Xr, Xg, and Xb are OLEDs, as the electron injection material (functional material) of the solution for electron injection layer formation described above, in addition to the nanoparticles of zinc oxide (ZnO) and magnesium-doped zinc oxide (MgZnO) described above, for example, quinoline, perylene, phenanthroline, bis-styryl, pyrazine, triazole, oxazole, oxadiazole, fluorenone, and derivatives and metal complexes thereof, more specifically, for example, 3,3'-bis(9H-carbazole-9-yl)biphenyl (mCBP), 1,3,5-tris(N-phenyl-benzimidazol-2-yl)benzene (TPBI), 3-phenyl-4(1'-naphthyl)-5-phenyl-1,2,4-triazole (TAZ), 1,10-phenanthroline, and Alq (tris(8-hydroxyquinoline)aluminum) can be used.

Further, as the solvent of the solution for electron injection layer formation in the case of OLEDs, the same solvents as those in the case of QLEDs described above can be used.

Then, a thin metal film such as aluminum or silver is formed on the electron injection layer 24e as the second electrode (cathode electrode) 25 using, for example, vapor deposition or a sputtering method (step S9).

Subsequently, the inorganic sealing film 26 is formed covering the second electrode 25, and then the material (precursor) of the organic film 27 is applied by ink-jet on the inorganic sealing film 26 and cured, thereby forming the organic film 27, and the inorganic sealing film 28 is further formed in an upper layer overlying the organic film 27 (step S10). As a result, as illustrated in FIG. 2, the display device 2 including the light-emitting elements Xr, Xg, Xb of RGB is manufactured.

As described above, the display device 2 can be manufactured.

In the display device 2 of the present embodiment configured as described above, an oxetane monomer, an epoxy monomer, and a radical polymerization initiator are used in the light-emitting layer 24c. Thus, in the display device 2 of the present embodiment, even when the light-emitting layer 24c is formed by using a dripping technique, the light-emitting layer 24c having an appropriate film thickness can be easily formed with precision. Accordingly, in the present embodiment, the display device 2 that can prevent deterioration in display performance, even when the light-emitting layer 24c is formed by using a dripping technique, can be configured. Further, in the present embodiment, the light-emitting layer 24c having an appropriate film thickness is formed, making it possible to reliably prevent a reduction in luminous efficiency and the occurrence of current leakage in the pixels. As a result, in the present embodiment, the display device 2 having superior display performance can be configured with ease.

Figure 7:
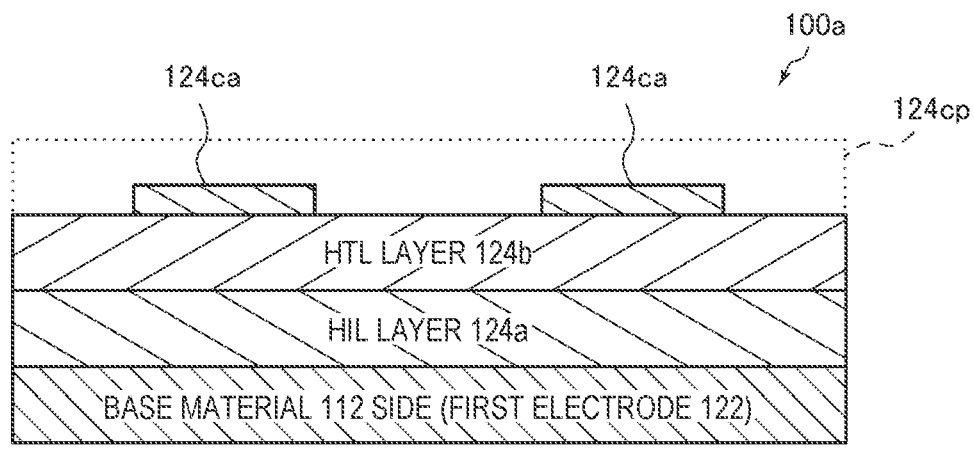
FIG. 7 illustrates diagrams for explaining a problem in comparative examples, FIG. 7 (a) and FIG. 7(b) being diagrams for explaining formation states of a light-emitting layer of the comparative examples when different amounts of a monomer are added.
Figure 7:
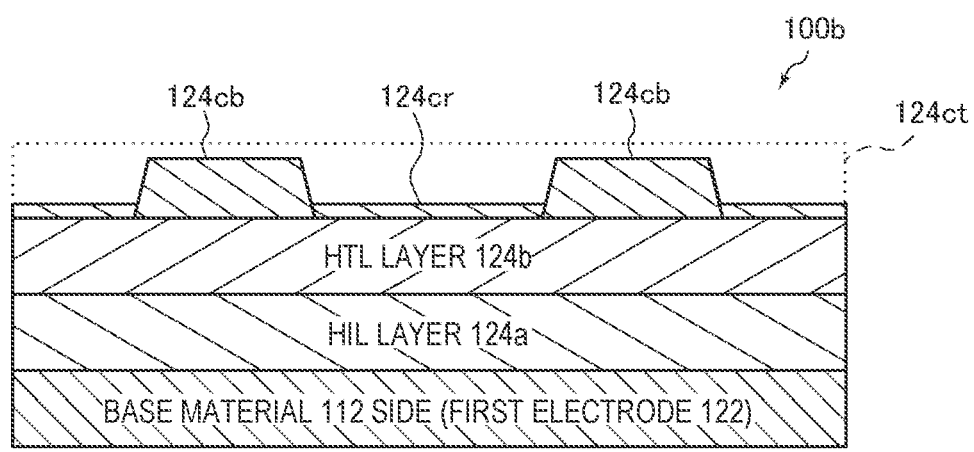

Here, effects of the display device 2 of the present embodiment will be specifically described with reference to FIG. 7. FIG. 7 illustrates diagrams for explaining a problem in comparative examples, FIG. 7(a) and FIG. 7(b) being diagrams for explaining formation states of a light-emitting layer of the comparative examples when different amounts of a monomer are added. Note that, in FIG. 7, the edge cover film partitioning each pixel unit is omitted.

First, the comparative example will be described. In the comparative example, only an oxetane monomer was used as the polymer resin material in the solution for light-emitting layer formation, without the addition of an epoxy monomer. Then, the formation state of the light-emitting layer when the added amount of the oxetane monomer was changed was confirmed. Note that, as the comparative example, a hole injection layer 124a and a hole transport layer 124b were sequentially formed on a base material 112 (first electrode 122). Then, comparative example 100a obtained by dripping a solution 124cp for light-emitting layer formation, including an oxetane monomer exceeding a predetermined amount added thereto, onto the hole transport layer 124b, and a comparative example 100b obtained by dripping a solution 124ct for light-emitting layer formation, including an oxetane monomer less than the predetermined added amount added thereto, onto the hole transport layer 124b were prepared.

In comparative example 100a, when exposure and patterning and the like were performed on the solution 124cp for light-emitting layer formation, thereby forming a light-emitting layer 124ca, it was found that, as illustrated in FIG. 7(a), the amount of film reduction from the solution 124cp for light-emitting layer formation increases, and thus a light-emitting layer having the desired film thickness, shape, and the like cannot be formed.

On the other hand, in comparative example 100b, when exposure and patterning and the like were performed on the solution 124ct for light-emitting layer formation, thereby forming a light-emitting layer 124cb, it was found that, as illustrated in FIG. 7(b), the amount of film reduction from the solution 124cp for light-emitting layer formation increases, and thus a light-emitting layer having the desired film thickness, shape, and the like cannot be formed. That is, as illustrated in these drawings, line/space in the light-emitting layer 124cb deteriorates and the tapered surface cannot be appropriately formed, causing a gap to occur with the edge cover film (not illustrated), or a film remaining portion 124cr connecting adjacent light-emitting elements to occur.

On the other hand, in the product of the present embodiment, as illustrated in FIG. 4, it was demonstrated that the light-emitting layer 24c having an island shape can be precisely formed between the edge cover films 23 with an appropriate film thickness. That is, it was confirmed that the product of the present embodiment has the complementary effect of appropriately utilizing the characteristics of an oxetane monomer, which has a slow polymerization initiation reaction and a fast polymerization reaction, and the characteristics of an epoxy monomer, which has a fast polymerization initiation reaction and a slow polymerization reaction, making it possible to precisely form the light-emitting layer 24c with an appropriate film thickness.

First Modified Example

Figure 8:
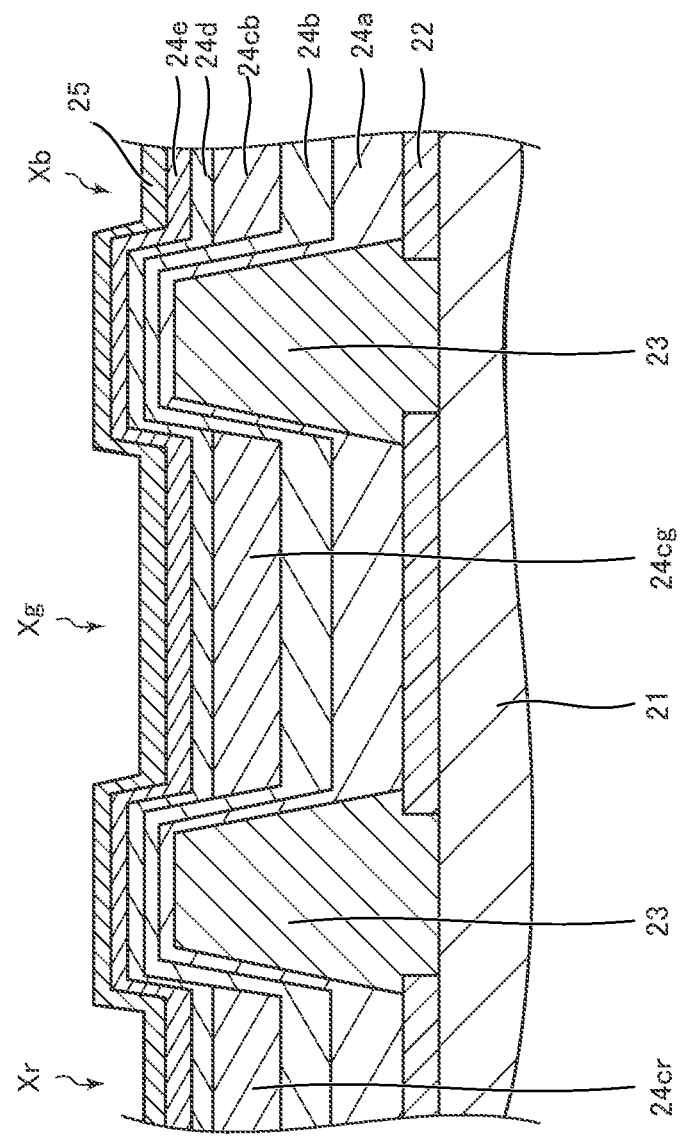
FIG. 8 is a cross-sectional view illustrating a first modified example of the display device described above.

FIG. 8 is a cross-sectional view illustrating a first modified example of the display device described above.

In the drawing, a main difference between this first modified example and the first embodiment described above is that the hole injection layer 24a and the hole transport layer 24b are provided as common layers common to all subpixels. Note that elements common to those in the first embodiment are denoted by the same reference signs, and duplicate description thereof will be omitted.

In the display device 2 of the first modified example, as illustrated in FIG. 8, the hole injection layer 24a and the hole transport layer 24b are formed in a solid-like manner in common to the light-emitting elements Xr, Xg, and Xb. That is, the hole injection layer 24a and the hole transport layer 24b can each be formed by the ink-jet method in the first embodiment as well as by other dripping techniques such as a spin-coating method.

With the above configuration, the first modified example can achieve actions and effects similar to those of the first embodiment described above. Further, the hole injection layer 24a and the hole transport layer 24b are formed of a common layer, and thus the manufacturing process of the display device 2 can be simplified as well.

Second Modified Example

Figure 9:
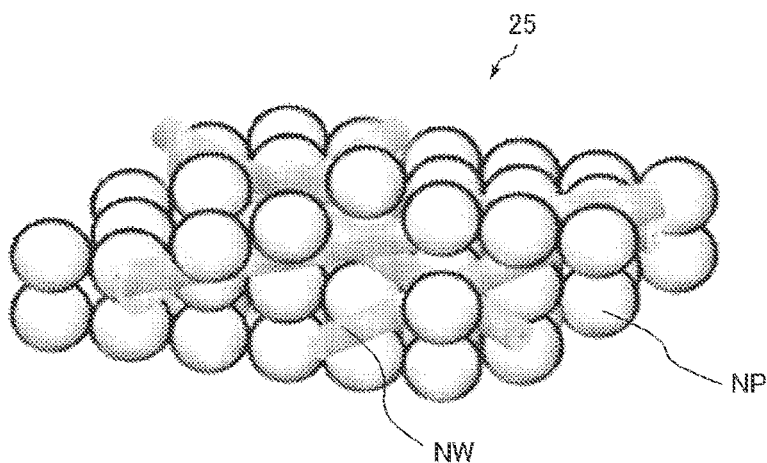
FIG. 9 illustrates diagrams for explaining a configuration of the main portions of a second modified example of the display device, FIG. 9 (a) being a perspective view illustrating a specific configuration of a second electrode in the second modified example, FIG. 9 (b) being a diagram illustrating a specific configuration of the light-emitting element layer in the second modified example, and FIG. 9(c) being a graph showing an effect of the second modified example.
Figure 9:
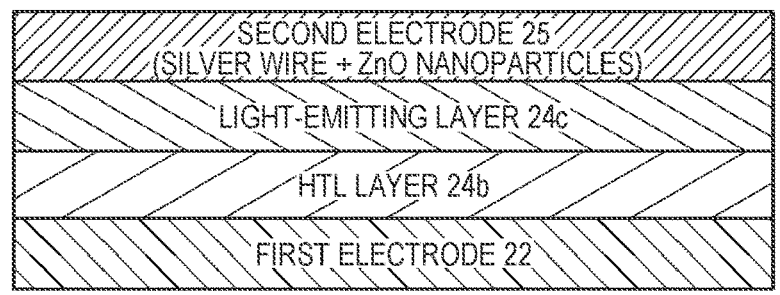
Figure 9:
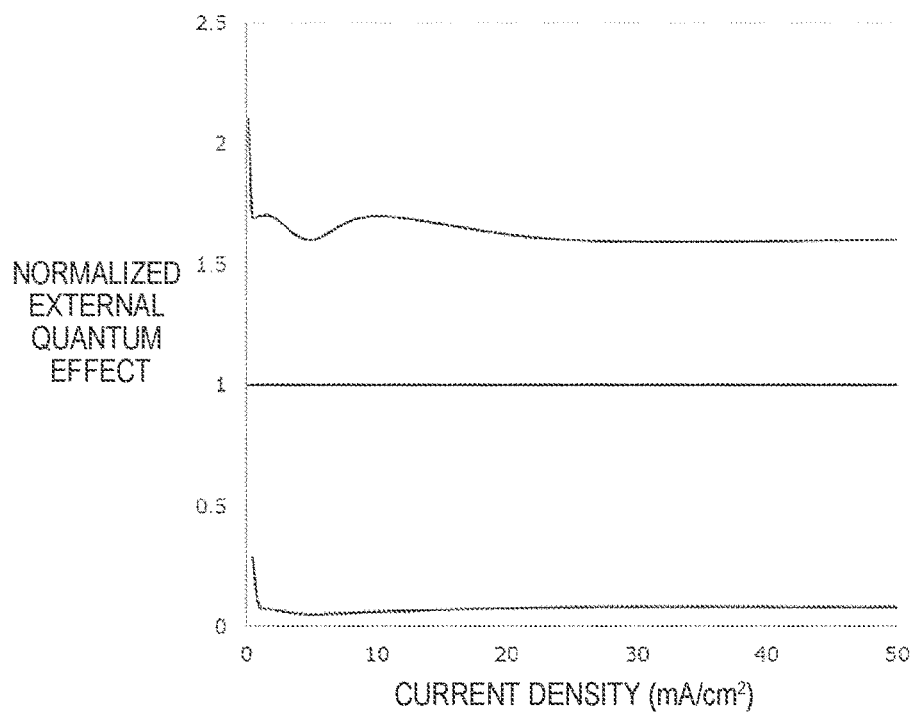

FIG. 9 illustrates diagrams for explaining a configuration of the main portions of a second modified example of the display device described above, FIG. 9(a) being a perspective view illustrating a specific configuration of the second electrode in the second modified example, FIG. 9(b) being a diagram illustrating a specific configuration of the light-emitting element layer in the second modified example, and FIG. 9(c) being a graph showing an effect of the second modified example.

In the drawing, a main difference between this second modified example and the first embodiment described above is that the second electrode 25 including the electron injection layer and the electron transport layer is provided. Note that elements common to those in the first embodiment are denoted by the same reference signs, and duplicate description thereof will be omitted.

In the display device 2 of this second modified example, as illustrated in FIG. 9(a), the second electrode 25 includes metal nanowires, for example, silver nanowires NW, and zinc oxide (ZnO) nanoparticles NP serving as an electron injection layer material and an electron transport material. That is, a combined solution obtained by combining a silver nanowire solution and a zinc oxide nanoparticle solution at a desired ratio and agitating the solution is applied and then dried, thereby obtaining the second electrode 25 in which the silver nanowires NW and the zinc oxide nanoparticles NP are combined. Specifically, the silver nanowires NW are randomly disposed in three dimensions, and a gap between the zinc oxide nanoparticles NP (average particle size from 1 to 30 nm) is configured so that the silver nanowires NW passes therethrough.

Further, in the display device 2 of this second modified example, a configuration is adopted in which, as illustrated in FIG. 9(b), the first electrode 22 (anode electrode), the HTL layer (hole transport layer) 24b, the light-emitting layer 24c (quantum dot light-emitting layer, for example), and the second electrode (common cathode electrode) 25 including the electron injection layer and the electron transport layer are provided in this order.

Further, in the configuration illustrated in FIG. 9(a), a contact area in the second electrode 25 between the silver nanowires NW and the zinc oxide nanoparticles NP serving as the electron transport material increases and thus, as shown in FIG. 9(c), in a range of current density from 0 to 50 [milliampere/centimeters squared], an external quantum effect UB (normalized value with respect to reference value) of the light-emitting element X in this second modified example is found to be significantly improved compared to an external quantum effect UA (reference value of each current density=1) of the light-emitting element X configured as illustrated in FIG. 3, that is, with the second electrode 25 formed on the electron injection layer (zinc oxide nanoparticle layer) 24e and a normalized external quantum efficiency Ua (normalized value with respect to reference value) of the light-emitting element including a cathode electrode of a general silver thin film.

Further, the number of processes can be reduced in comparison to a case in which the electron transport layer 24d, the electron injection layer 24e, and the second electrode (common cathode) 25 are formed in separate processes.

Further, if there are too many metal nanowires NW, an electron transport performance to the light-emitting layer 24c deteriorates and, if there are too few metal nanowires NW, a resistance value increases. Thus, a volume ratio of the metal nanowires NW to the ZnO nanoparticles NP is from 1/49 to 1/9.

With the above configuration, this second modified example can achieve actions and effects similar to those of the first embodiment described above.

Second Embodiment

Figure 10:
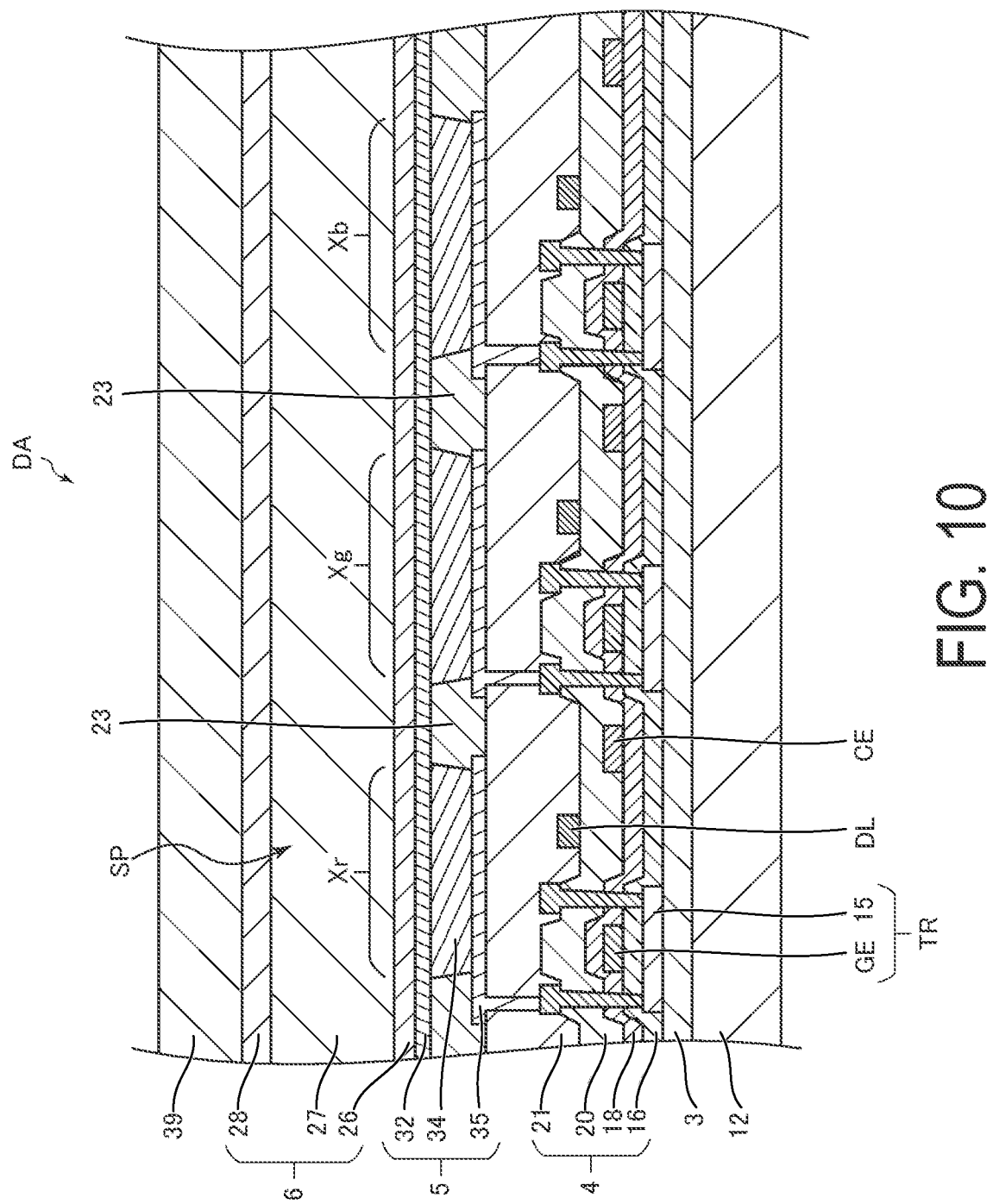
FIG. 10 is a cross-sectional view illustrating a configuration of the main portions of the display device according to a second embodiment of the disclosure.
Figure 11:
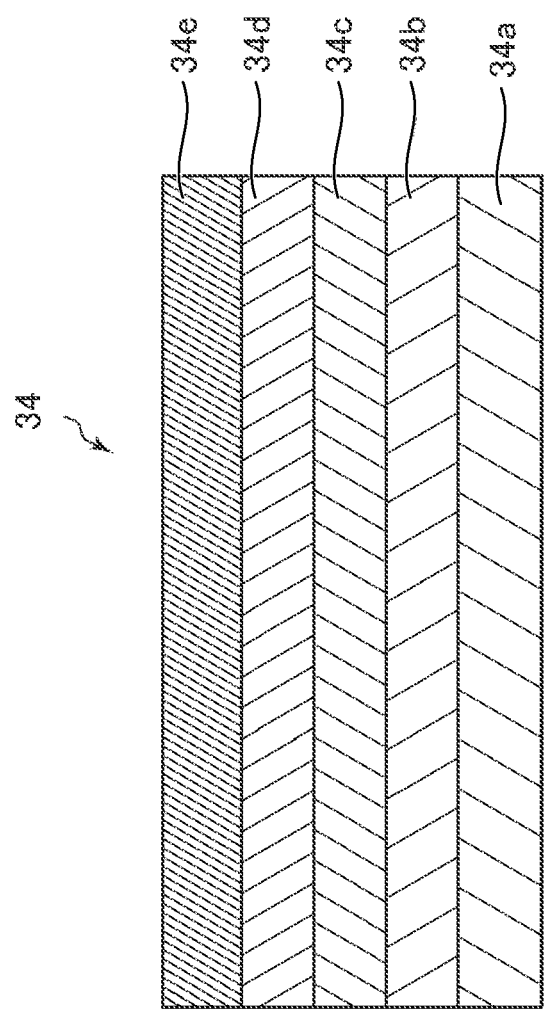
FIG. 11 is a cross-sectional view illustrating a specific configuration of the function layer illustrated in FIG. 10.
Figure 12:
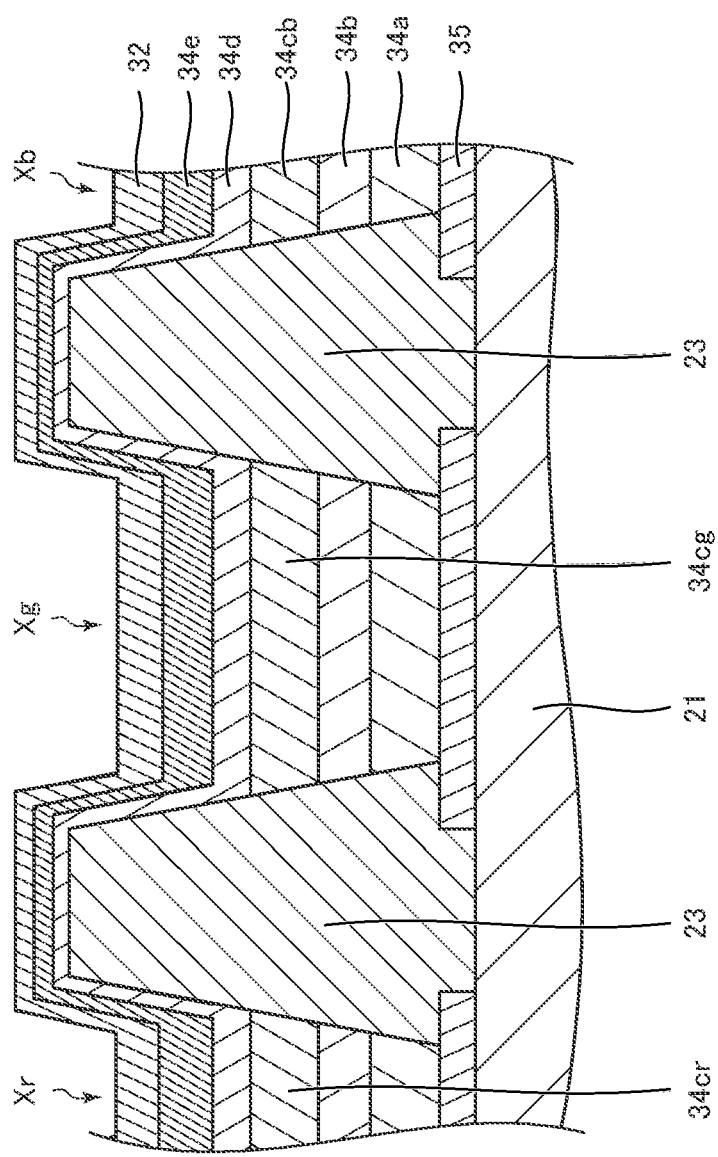
FIG. 12 is a cross-sectional view illustrating a specific configuration example of a light-emitting element illustrated in FIG. 10.

FIG. 10 is a cross-sectional view illustrating a configuration of the main portions of the display device according to a second embodiment of the disclosure. FIG. 11 is a cross-sectional view illustrating a specific configuration of the function layer illustrated in FIG. 10. FIG. 12 is a cross-sectional view illustrating a specific configuration example of a light-emitting element illustrated in FIG. 10.

In the drawings, a main difference between the present embodiment and the first embodiment described above is that the structure is inverted with a first electrode 35 serving as the cathode electrode, a function layer 34, and a second electrode 32 serving as the anode electrode provided in this order from the thin film transistor layer 4 side. Note that elements common to those in the first embodiment are denoted by the same reference signs, and duplicate description thereof will be omitted.

In the display device 2 of the present embodiment, as illustrated in FIG. 10, a first electrode (cathode electrode) 35, a function layer 34, and a second electrode (anode electrode) 32 are sequentially provided on the thin film transistor layer 4 in the light-emitting elements Xr, Xg, and Xb. Further, the function layer 34, as illustrated in FIG. 11, is formed by layering an electron injection layer 34a, an electron transport layer 34b, a light-emitting layer 34c, a hole transport layer 34d, and a hole injection layer 34e in this order from the lower layer side.

Further, in the display device 2 of the present embodiment, as illustrated in FIG. 12, the light-emitting elements Xr, Xg, Xb are partitioned by the edge cover film 23 serving as a bank, and the first electrode 35 having an island shape, the electron injection layer 34a having an island shape, the electron transport layer 34b having an island shape, and light-emitting layers 34cr, 34cg, 34cb having island shapes (collectively referred to as light-emitting layer 34c) are provided for each light-emitting element X. Further, in the light-emitting element X, the hole transport layer 34d that is solid-like, the hole injection layer 34e that is solid-like, and the second electrode 32 that is solid-like, all common to all subpixels SP, are provided.

With the above configuration, the present embodiment can achieve actions and effects similar to those of the first embodiment.

Modified Example

Figure 13:
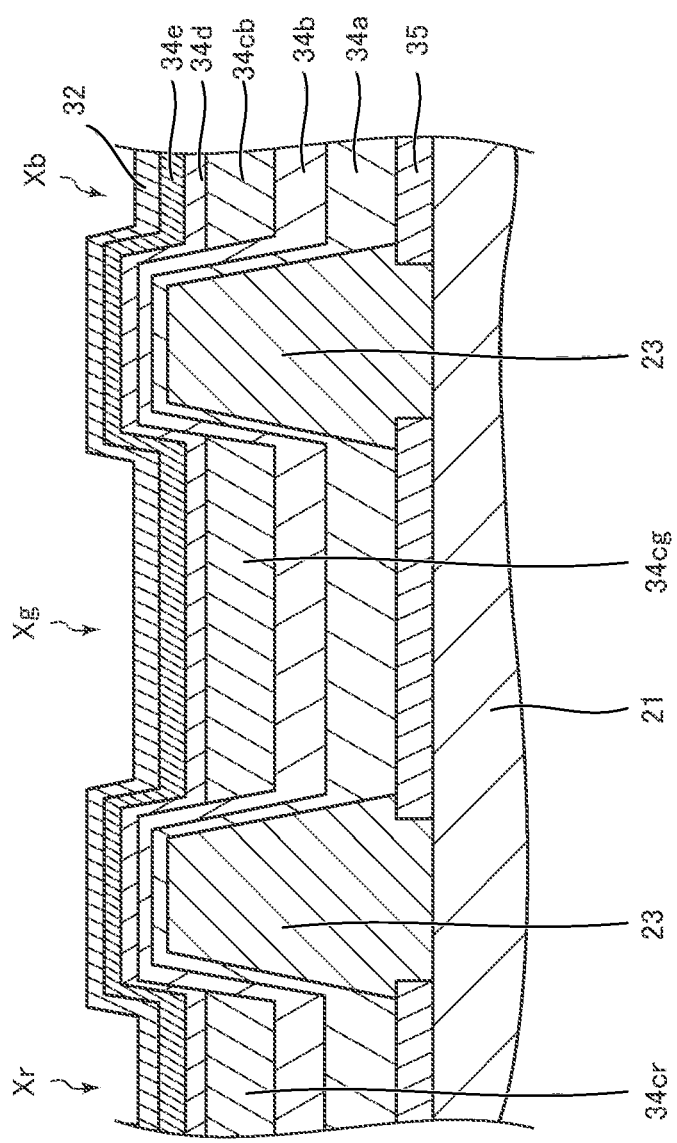
FIG. 13 is a cross-sectional view illustrating a modified example of the display device illustrated in FIG. 10.

FIG. 13 is a cross-sectional view illustrating a modified example of the display device illustrated in FIG. 10.

In the drawing, a main difference between this modified example and the second embodiment described above is that the electron injection layer 34a and the electron transport layer 34b are provided as common layers common to all subpixels. Note that elements common to those in the second embodiment described above are denoted by the same reference signs, and duplicate description thereof will be omitted.

In the display device 2 of this modified example, as illustrated in FIG. 13, the electron injection layer 34a and the electron transport layer 34b are formed in a solid-like manner in common to the light-emitting elements Xr, Xg, and Xb. That is, the electron injection layer 34a and the electron transport layer 34b can each be formed by the ink-jet method in the second embodiment as well as by other dripping techniques such as a spin-coating method.

With the above configuration, this modified example can achieve actions and effects similar to those of the second embodiment described above. Further, the electron injection layer 34a and the electron transport layer 34b are formed of a common layer, and thus the manufacturing process of the display device 2 can also be simplified.

INDUSTRIAL APPLICABILITY

The disclosure is useful in a display device and a method of manufacturing a display device that can prevent display performance deterioration even when a light-emitting layer is formed by using a dripping technique.

The invention claimed is:

1. A display device provided with a display region including a plurality of pixels and a frame region surrounding the display region, the display device comprising:
a thin film transistor layer; and
a light-emitting element layer including a plurality of light-emitting elements, each including a first electrode, a light-emitting layer, and a second electrode, and each having a different luminescent color,
wherein, in the light-emitting layer, an oxetane monomer, an epoxy monomer, and a radical polymerization initiator are used.

2. The display device according to claim 1, wherein the oxetane monomer includes an oxetane group and a charge transport material.

3. The display device according to claim 2, wherein the charge transport material is TPD and a derivative thereof.

4. The display device according to claim 1, wherein the epoxy monomer includes an alicyclic epoxy or a glycidyl epoxy.

5. The display device according to claim 1, wherein the epoxy monomer includes an epoxy group and a charge transport material.

6. The display device according to claim 5, wherein the charge transport material is TPD, carbazole, and derivatives thereof.

7. The display device according to claim 1, wherein a combination ratio of the oxetane monomer and the epoxy monomer is a value within a range from 95:5 to 50:50.

8. The display device according to claim 1, wherein the radical polymerization initiator is a photoacid generator.

9. The display device according to claim 8, wherein the photoacid generator includes a salt obtained by combining an iodonium salt-based or sulfonium salt-based cation and an anion of $(Rf)_n PF_{6-n}$ (where Rf is a perfluoroalkyl group), $B(C_6F_5)_4$, $SbF_6$, $PF_4$, $BF_4$, $CF_3SO_3$, $HSO_4$, or $SO_4^{2-}$.

10. The display device according to claim 1, wherein the light-emitting layer is a quantum dot light-emitting layer including quantum dots.

11. The display device according to claim 10, wherein the quantum dot light-emitting layer includes
a red quantum dot light-emitting layer configured to emit red light,
a green quantum dot light-emitting layer configured to emit green light, and
a blue quantum dot light-emitting layer configured to emit blue light.

12. A method of manufacturing a display device provided with a display region including a plurality of pixels and a frame region surrounding the display region, the display device including a thin film transistor layer, and a light-emitting element layer including a plurality of light-emitting elements, each including a first electrode, a light-emitting layer, and a second electrode, and each having a different luminescent color, the method comprising:

dripping a solution configured to form the light-emitting layer, the solution including a predetermined solvent, an oxetane monomer, an epoxy monomer, and a radical polymerization initiator, above the first electrode;

exposing the solution by, with an exposure mask placed above the solution, irradiating the solution with a predetermined irradiation light from above the exposure mask;

forming an intermediate layer of the light-emitting layer by drying the solvent in the solution;

patterning the intermediate layer in a predetermined shape by performing a development process on the intermediate layer using a predetermined developing solution; and forming the light-emitting layer above the first electrode by curing the intermediate layer patterned.

13. The method of manufacturing a display device according to claim 12, wherein the dripping of the solution, the exposure, the forming of the intermediate layer, the patterning, and the forming of the light-emitting layer are repeatedly performed sequentially for each luminescent color.

\* \* \* \* \*